US009112250B1

United States Patent
Tsironis

(10) Patent No.: US 9,112,250 B1
(45) Date of Patent: Aug. 18, 2015

(54) WIDEBAND ATTENUATION AND PHASE CONTROLLER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 167 days.

(21) Appl. No.: 13/946,011

(22) Filed: Jul. 19, 2013

(51) Int. Cl.
*H01P 1/18* (2006.01)
*H01P 5/00* (2006.01)
*H01P 1/23* (2006.01)
*H01P 1/22* (2006.01)

(52) U.S. Cl.
CPC .. *H01P 5/00* (2013.01); *H01P 1/18* (2013.01); *H01P 1/181* (2013.01); *H01P 1/22* (2013.01); *H01P 1/23* (2013.01)

(58) Field of Classification Search
CPC ............... H01P 1/18; H01P 1/22; H01P 1/00
USPC .............. 333/81 A, 81 R, 158, 159, 263
See application file for complete search history.

(56) References Cited

U.S. PATENT DOCUMENTS

| 4,755,778 A * | 7/1988 | Chapell ..................... 333/159 |
| 7,646,268 B1 | 1/2010 | Tsironis |
| 2011/0115582 A1* | 5/2011 | Simpson ..................... 333/263 |

* cited by examiner

*Primary Examiner* — Stephen E Jones

(57) ABSTRACT

A continuously manually or remotely adjustable microwave attenuator and linear phase shifter is made using a two section slabline structure in which a "U" formed center conductor forms a line—stretcher to adjust the transmission phase and slivers of ferromagnetic material are inserted into the magnetic field of the slabline, or thin layers of dielectric material are inserted into the electric field serving either way to reducing the amplitude of the transmission factor, or increase the attenuation. The unit is manually or remotely controlled, in which case its transmission behavior can be calibrated on a VNA and used in test software for automated differential load pull operations.

11 Claims, 15 Drawing Sheets

Concept of variable attenuator - phase shifter (VAPS) in a slabline

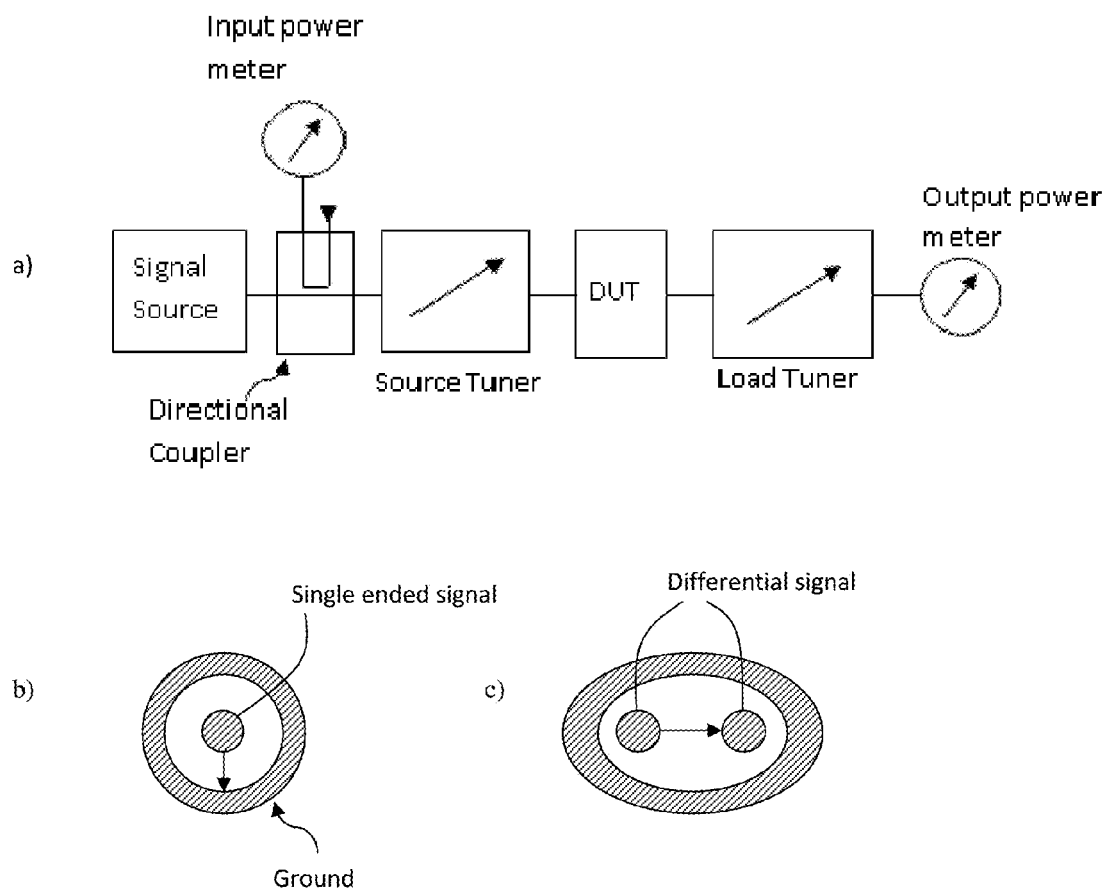
Figure 1: Prior art; a) single ended RF load pull system; b) single-ended mode; c) differential mode

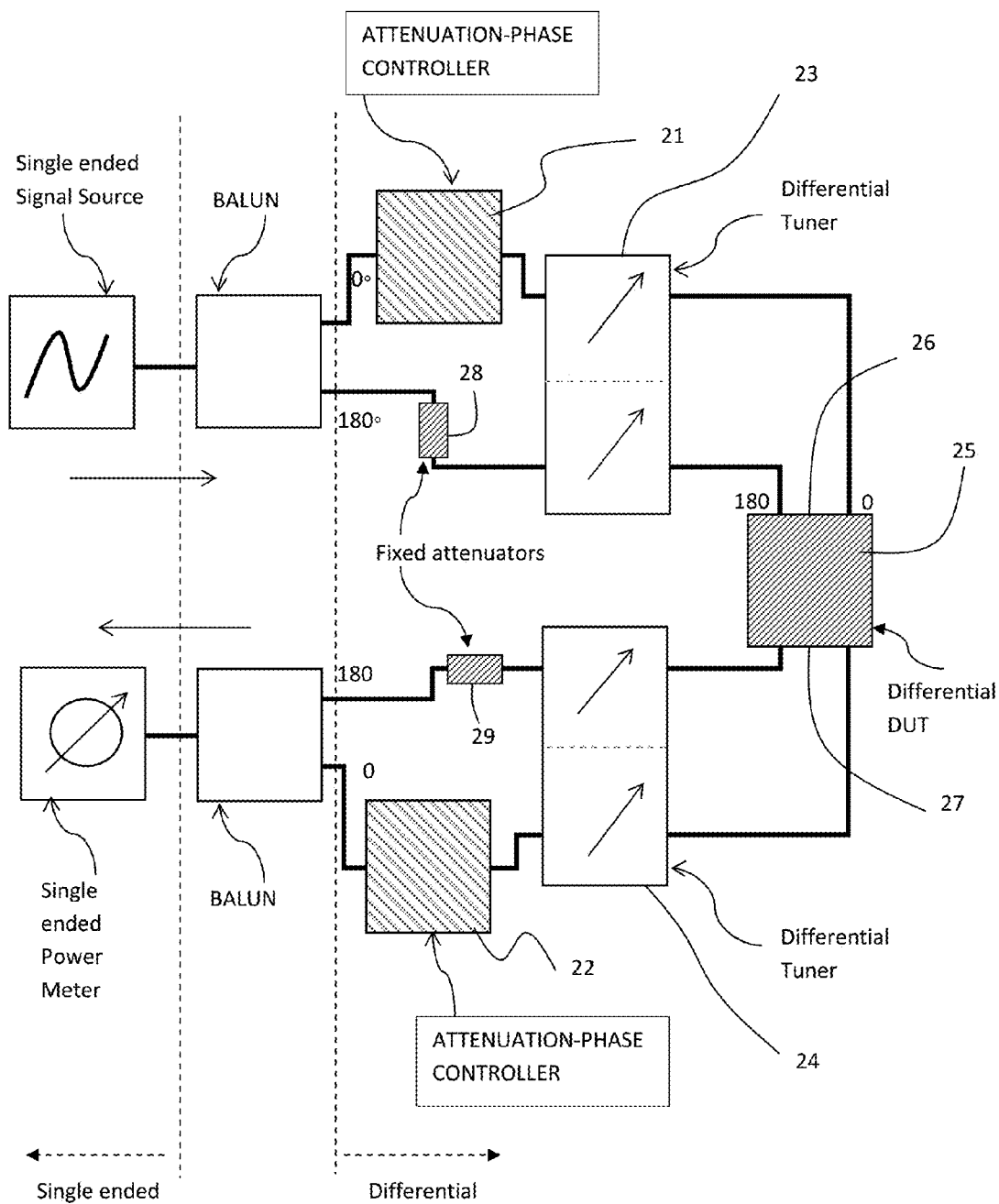
Figure 2: Partly prior art: Differential Load Pull System

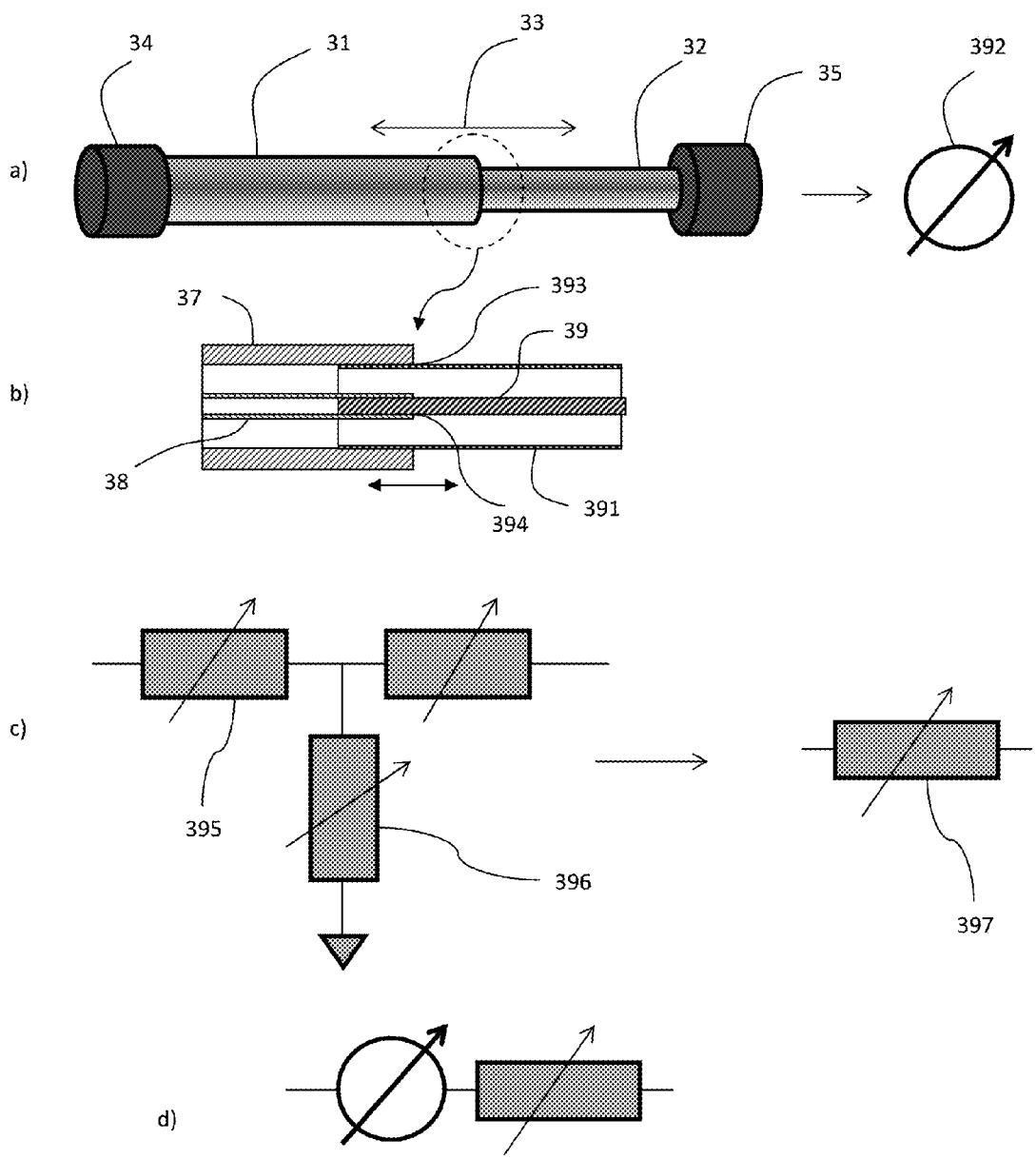
Figure 3: Prior art: a) linear coaxial phase shifter; b) variable attenuator; c) amplitude and phase controller; and symbols

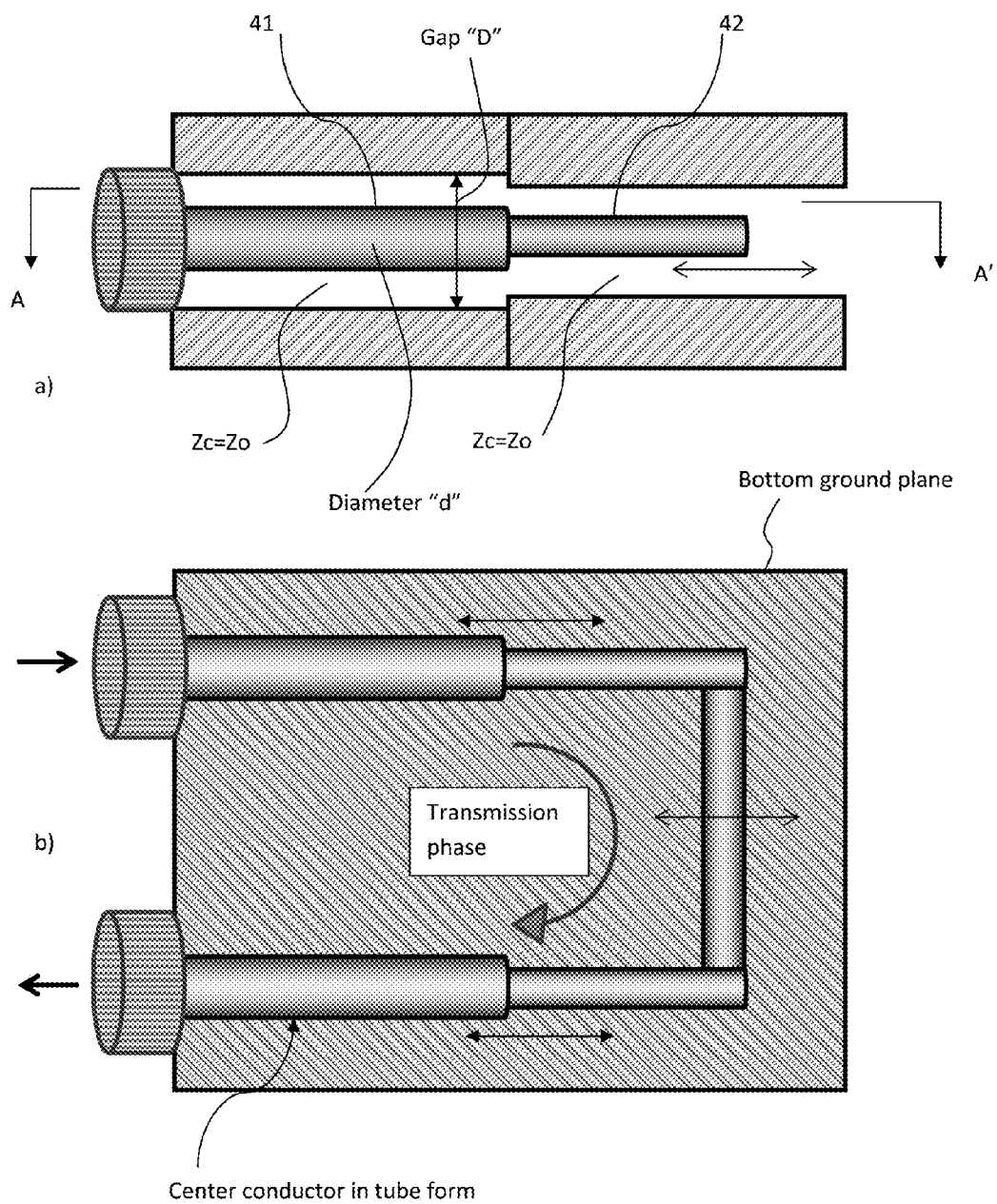
Figure 4: Prior art; linear phase shifter using slabline; a) side view, b) section A-A'

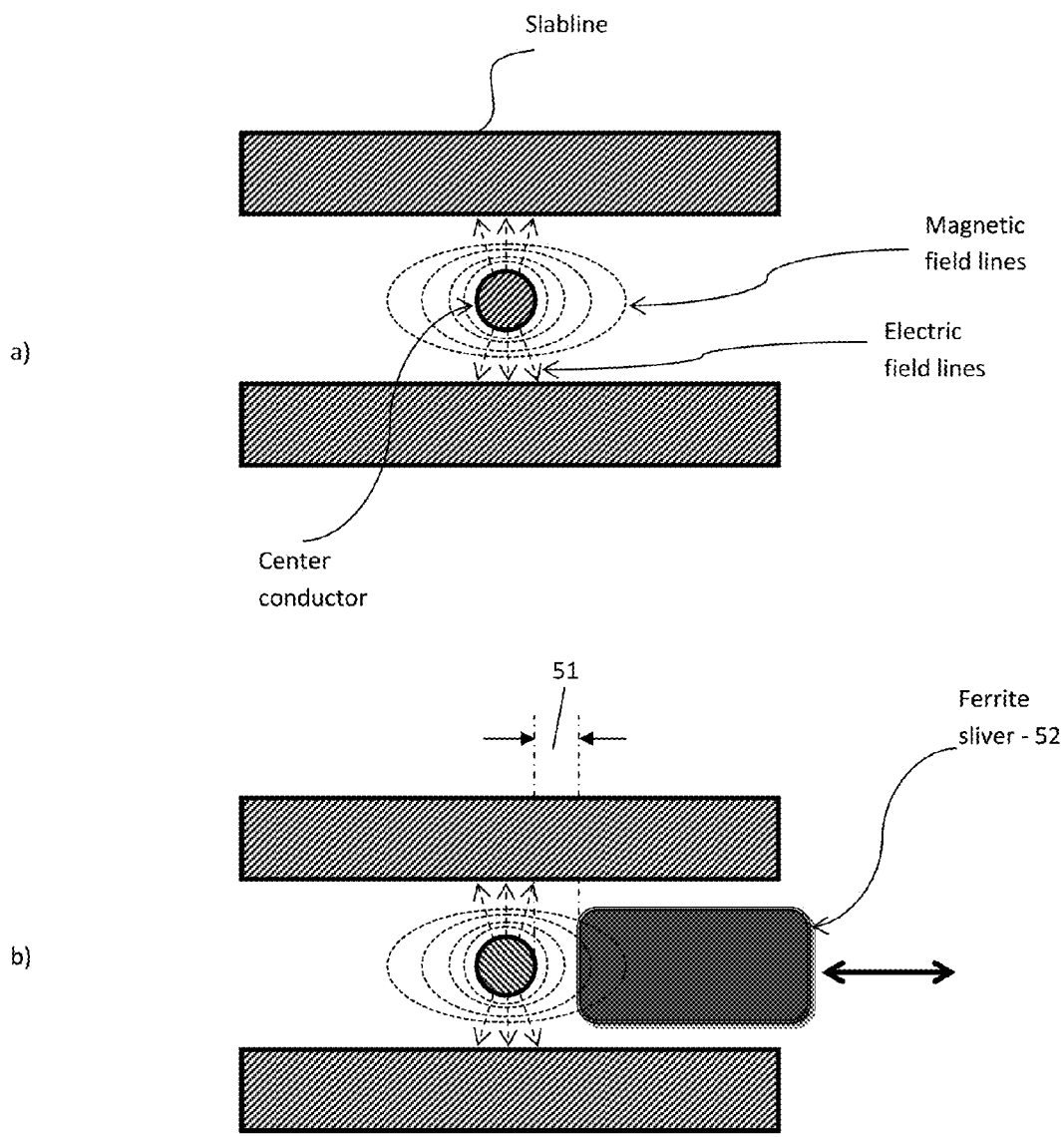
Figure 5: a) (prior art): Electromagnetic field lines in a slabline.; b) (new): Variable attenuation using Ferrite sliver in magnetic field

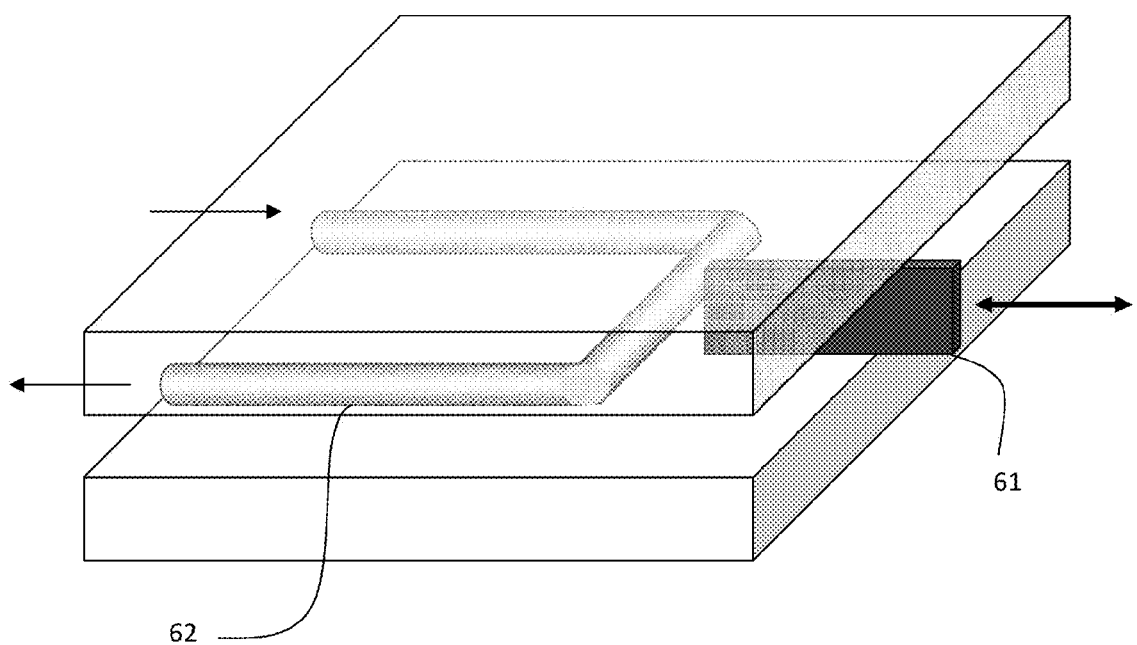
Figure 6: Variable attenuator in a slabline, version 1

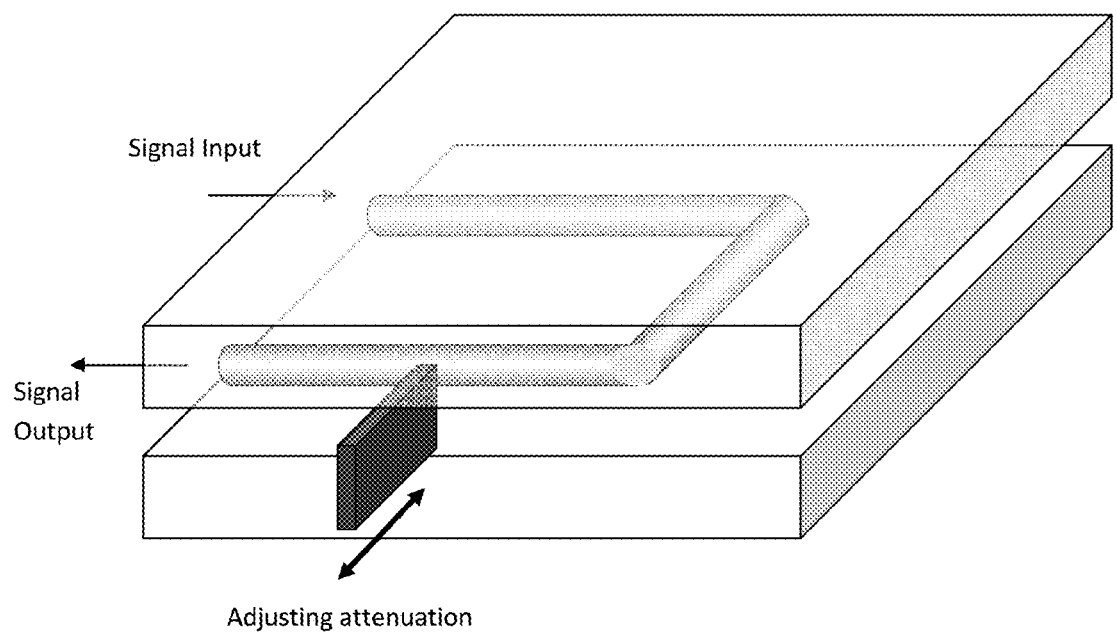
Figure 7: Variable attenuator in a slabline, version 2

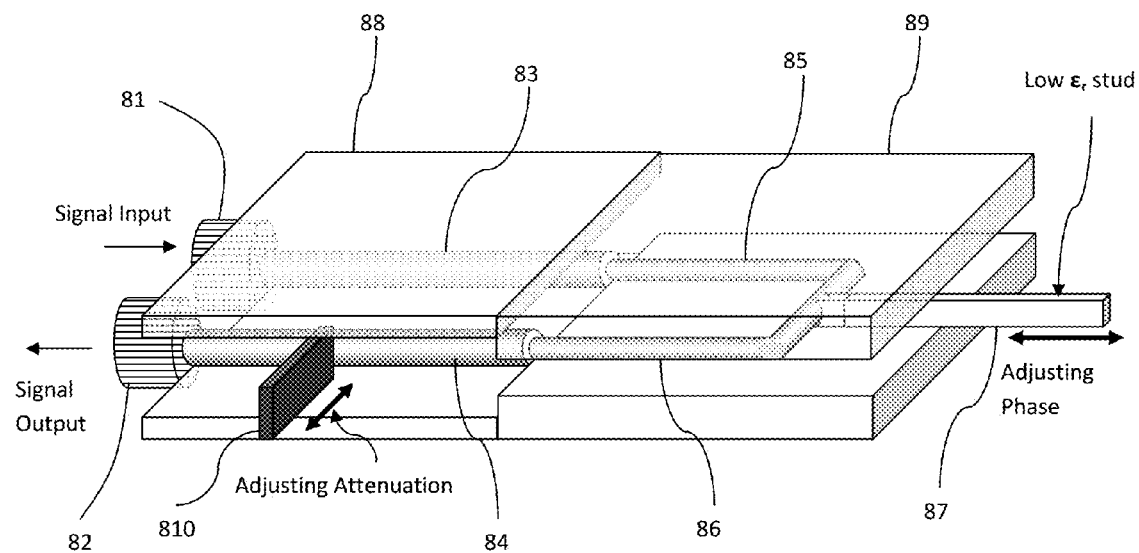
Figure 8: Concept of variable attenuator - phase shifter (VAPS) in a slabline

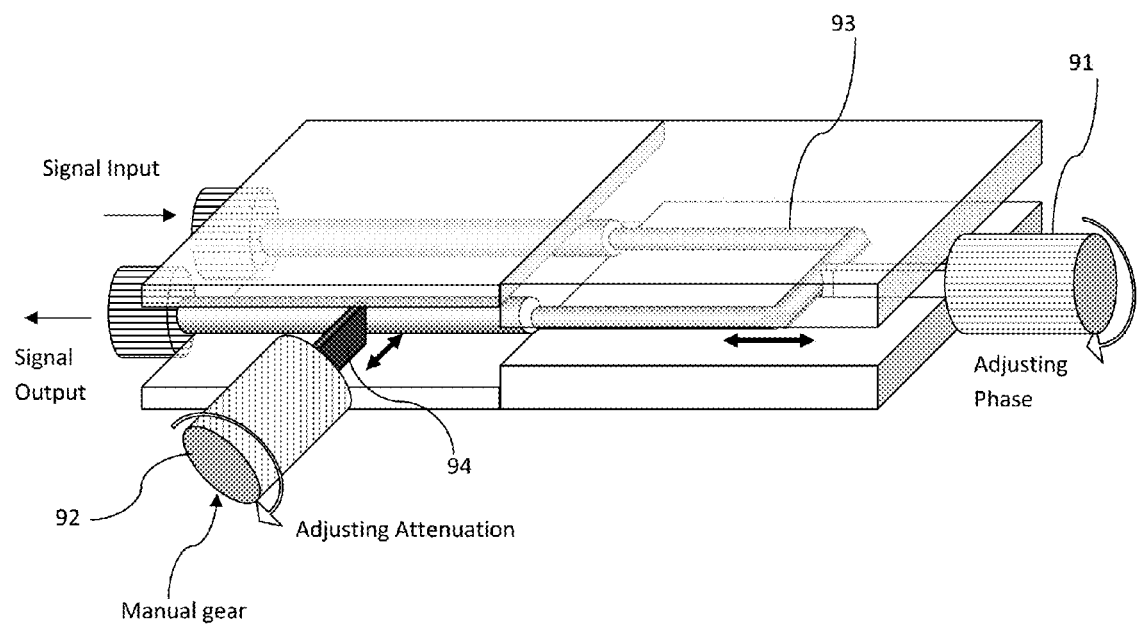
Figure 9: Practical embodiment of VAPS, 1

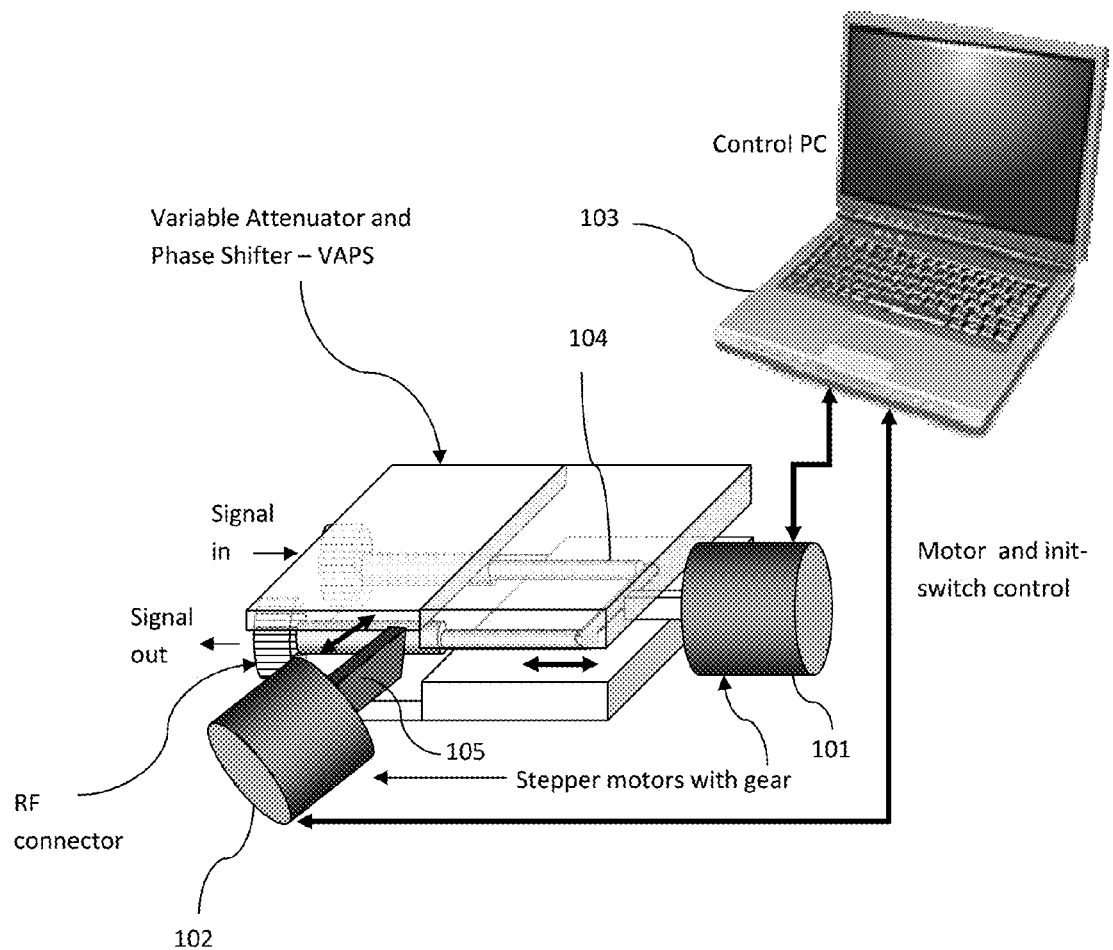
Figure 10: Automated VAPS

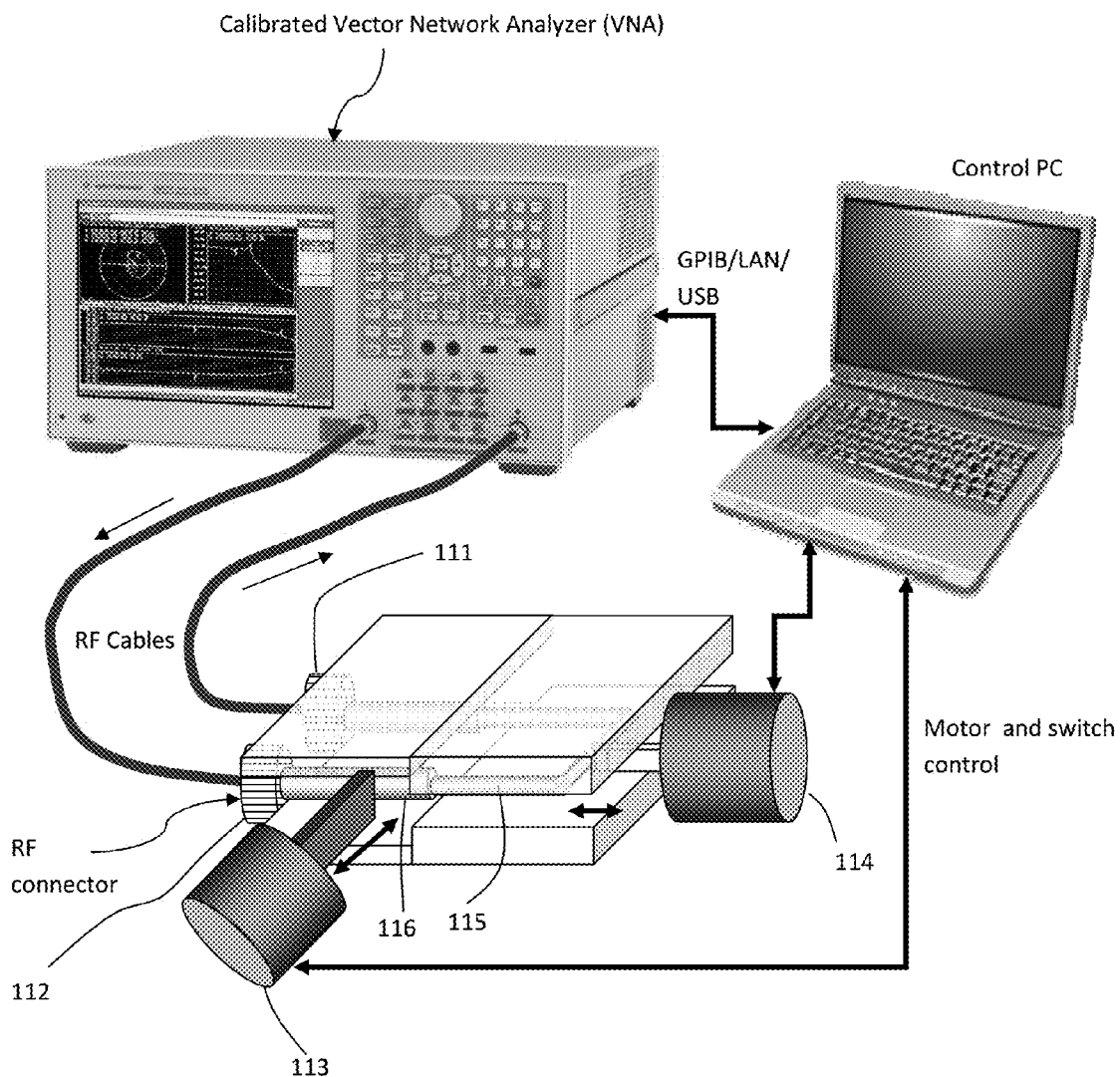
Figure 11: Calibration of VAPS using a pre-calibrated VNA

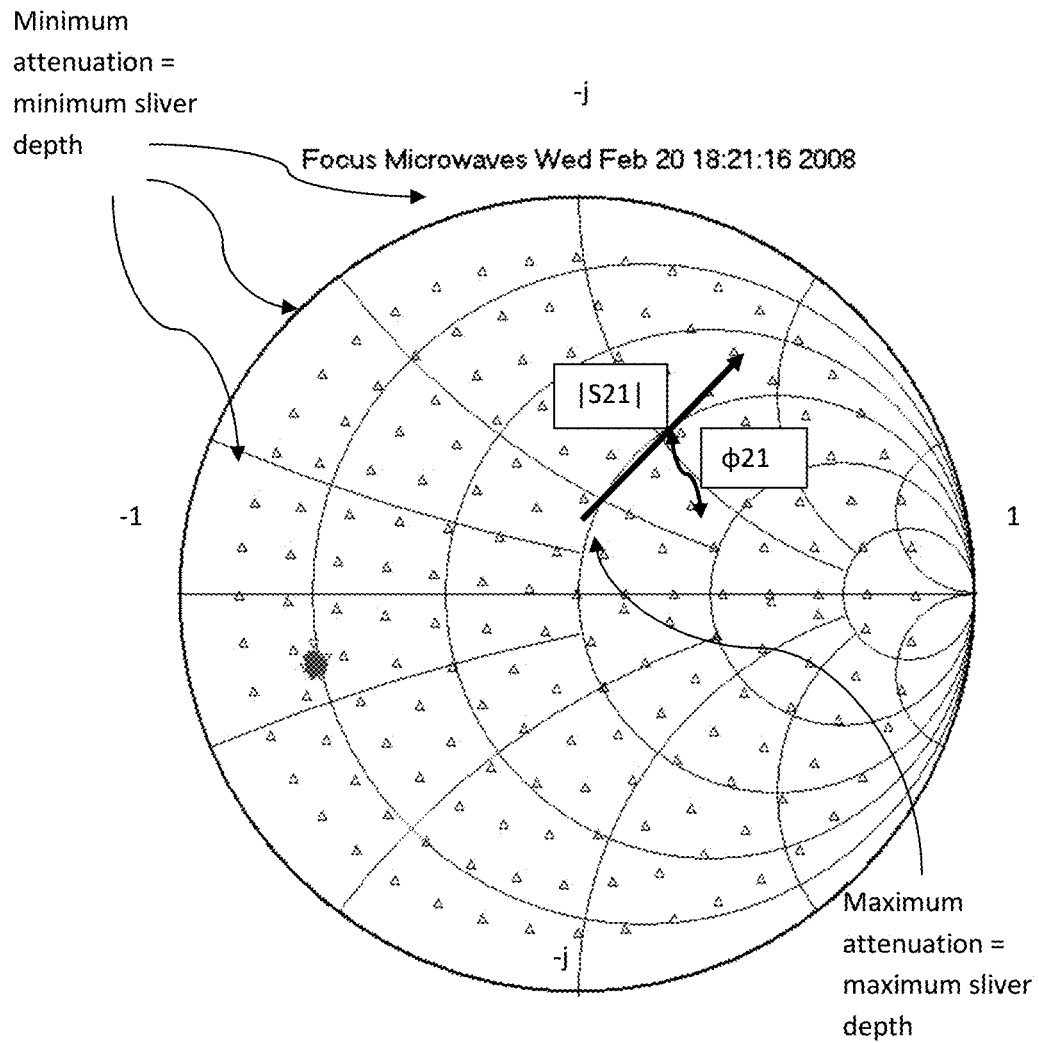
Figure 12: Transmission factor $S21=|S21|*exp(j\varphi 21)$ of VAPS as a function of sliver depth and line stretcher position

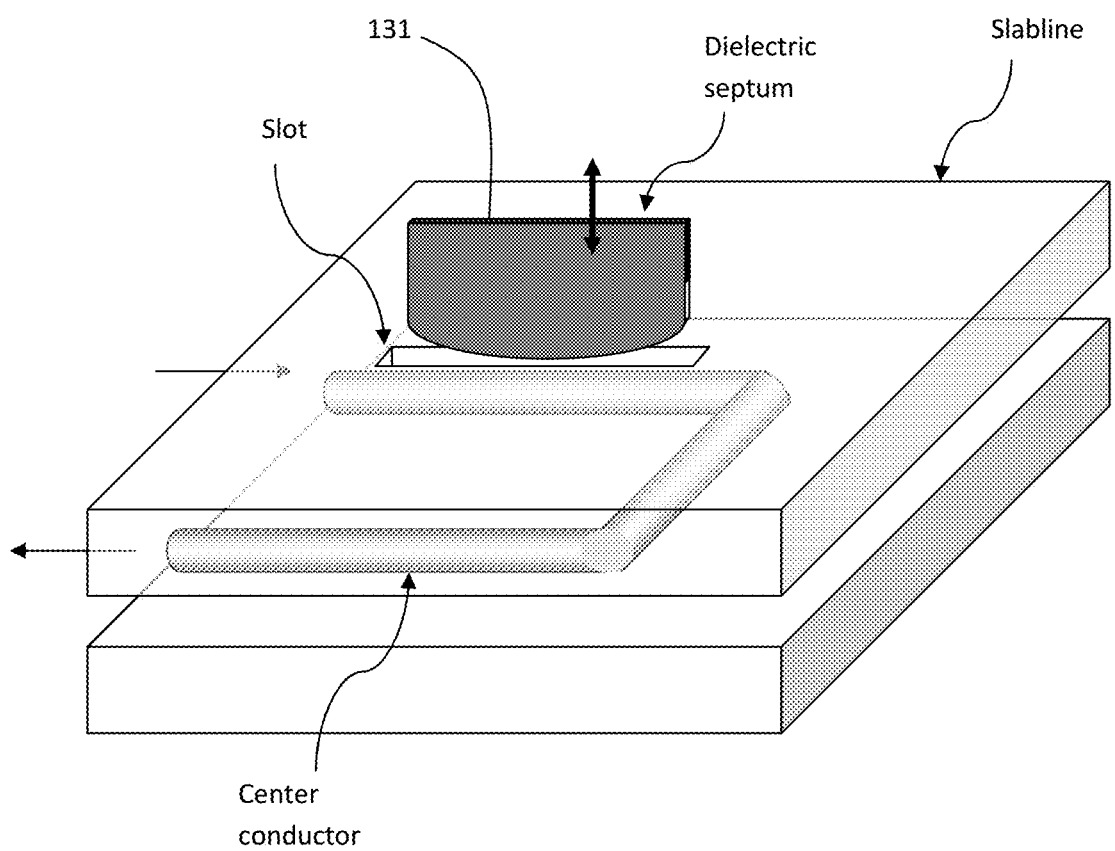
Figure 13: Slabline attenuator using dielectric sliver

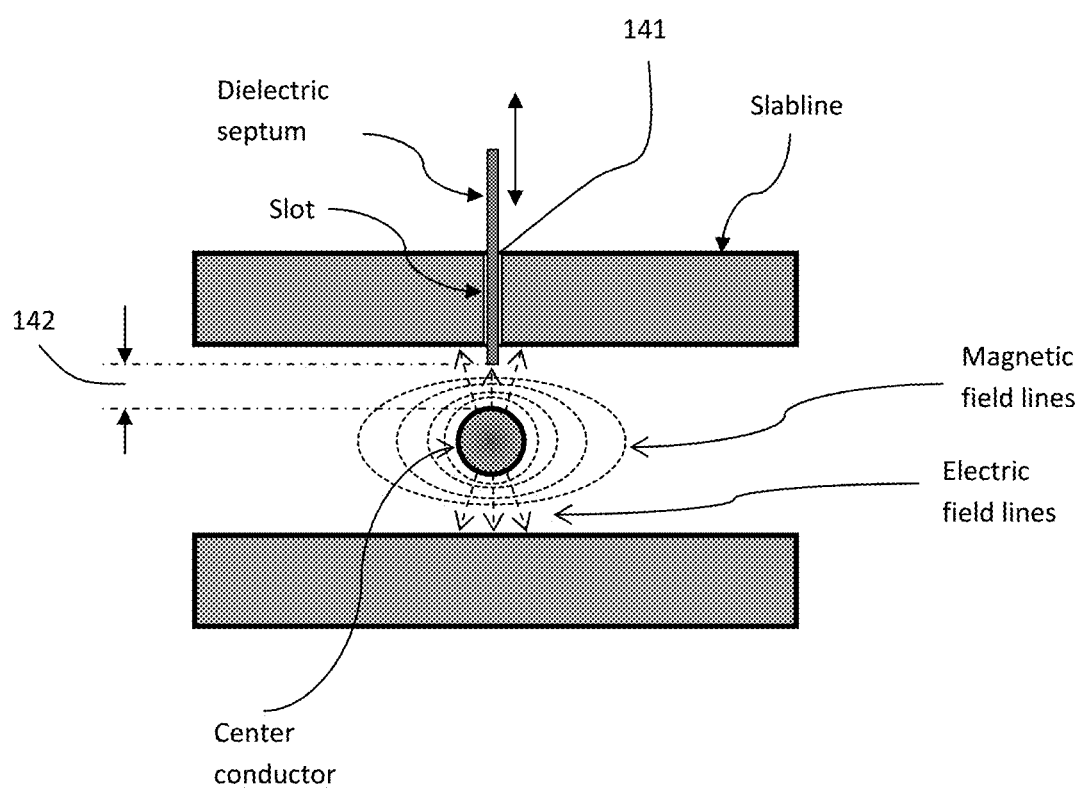
Figure 14: Slabline attenuator using dielectric sliver; cross section

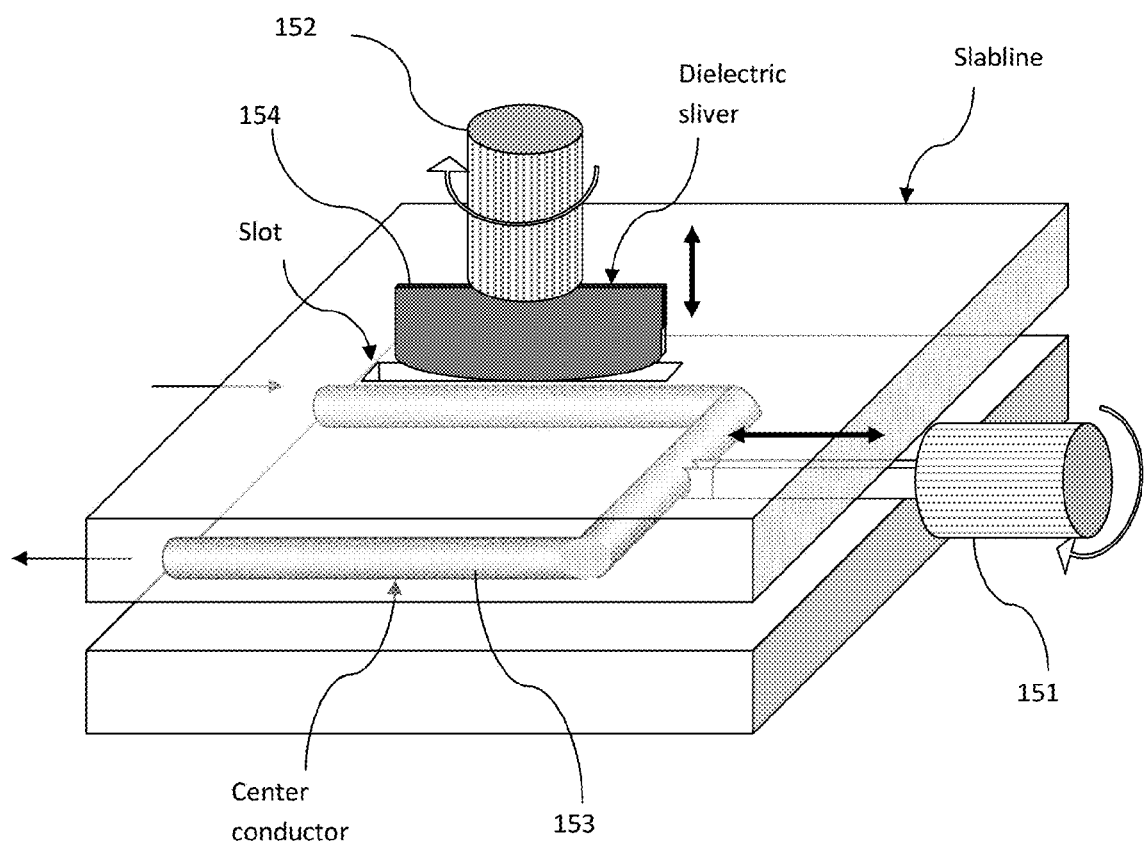
Figure 15: VAPS using dielectric sliver

WIDEBAND ATTENUATION AND PHASE CONTROLLER

PRIORITY CLAIM

This application claims priority on provisional application 61/680,742 filed on Aug. 8, 2012.

CROSS-REFERENCE TO RELATED ARTICLES

[1] Load pull characterization system for differential devices http://ieeexplore.ieee.org/xpl/login.jsp?tp=&arnumber=1459774&url=http%3A%2F%2Fieeexplore.ieee.org%2Fiel5%2F9891%2F31428%2F01459774.pdf%3Farnumber%3D1459774
[2] Directional Couplers: http://www.e-meca.com/rf-directional-coupler/directional-coupler-780.php
[3] "An Introduction to Multiport and Balanced Device Measurements" Agilent Application Note 1373-1, Multiport and Balanced Device Measurement Application Note Series
[4] http://en.wikipedia.org/wiki/Balun
[5] Variable Attenuators http://www.microwaves101.com/encyclopedia/attenuatorvariable.cfm
[6] Phase shifters; http://www.microwaves101.com/encyclopedia/phaseshifters.cfm
[7] "Waveguide Variable Attenuator", ELMIKA catalog page
[8] Step Attenuators; http://www.home.agilent.com/agilent/product.jspx?nid=-536900655.0.00&cc=US&lc=eng&s_kwcid=TC|6885|step%20attenuators||S|p|9068118496
[9] "Low frequency harmonic load pull tuner and method", C. TSIRONIS, U.S. Pat. No. 7,646,268
[10] Ferrite; http://en.wikipedia.org/wiki/Ferrite_%28magnet%29#Uses
[11] MICA; http://en.wikipedia.org/wiki/Mica#Electrical_and_electronic
[12] Foucault currents: http://en.wikipedia.org/wiki/Eddy_current
[13] Microlab Line Stretcher, ST Series, Datasheet

BACKGROUND OF THE INVENTION

This invention relates to testing of differential microwave transistors (DUT) in the frequency and time domain [1] using Load Pull. Load pull is the method by which the load impedance presented to the DUT at a given frequency is changed systematically and the DUT performance is registered, with the objective to find an optimum depending on the overall design objectives [1]. This may be maximum power, efficiency, linearity or else. The same is valid for the source side of the DUT. Passive (slide screw) tuners are used to emulate the various impedances presented to the DUT [1], (FIG. 1a). The electrical signals injected into the input of the DUT and extracted from the output can be measured using sampling devices, such as signal couplers [2]. At high power the (nonlinear) DUT is saturating and deforming the sinusoidal input signal. As a result part of the power is contained in harmonic frequency components. The DUT performance can only be optimized when all harmonic frequency components are impedance-matched properly. This requires independent harmonic tuning, mainly at the DUT output, but also at the DUT input.

Each port on a connectorized RF device comprises two terminals. When one terminal connection is used to transmit the RF signal and the other is used as a ground reference, the port is referred to as "single-ended" (FIG. 1b). Traditionally, most RF devices have been designed to operate in this mode. When a terminal is designed to reference a signal on another terminal (and not the ground terminal), it is operating in a "differential" mode (FIG. 1c). The terminal pair is known as a differential or "balanced" port. These circuits are designed to have a pair of electrically symmetrical signal paths. Signals are transmitted through the device 180 degrees out of phase with respect to one another. Any signal that is "common" or in-phase to both terminals will ideally be rejected, and will not pass through the circuit. This characteristic gives the device a lower sensitivity to electromagnetic interference (EMI). Differential devices cannot be easily tested with a traditional two-port network analyzer [3].

A differential load pull setup is shown in FIG. 2. A single ended signal source injects power into a BALUN [4]. A BALUN (Balanced-Unbalanced) is a component which generates a differential signal from a single ended one or the opposite. It has three terminals; the input terminal relative to a common (ground) terminal creates a single ended input/output port and two terminals create the differential output/input port. BALUNs can be used in both directions. The accuracy of the measurement depends on the precision with which the phase opposition and the amplitude equality of the signals at the differential port. Ideally the two signals must have the same amplitude and a phase difference of 180°. In reality this is never the case. Therefore a real test system shall provide for continuous and fine adjustment of the differential signal components, both in amplitude and phase, both before and after the DUT. In FIG. 2 this is done using the Variable Attenuation and Phase Shifter controllers (VAPS, 21, 22). The differential tuners (23, 24) create true differential impedance presented to the differential DUT (25) at both its input (26) and output (27) terminals [paper diff tuner]. Since the VAPS has a minimum attenuation this must be compensated by fixed attenuators (28, 29). This invention discloses manual and automated wideband attenuation and phase controllers.

PRIOR ART

Variable attenuators [5] and phase shifters [6] have been known for a long time. Finely adjustable variable attenuators are known in waveguide transmission structures [7]; in coaxial microwave structures only step attenuators are known [8]. Waveguide transmission lines are impractical for frequencies below 3 GHz, because of their size (a WR 340 waveguide—2.2-3.3 GHz, is 3.56" wide and 1.86" high) and limited frequency bandwidth. Linear, finely adjustable phase shifters (line stretchers) are also known [9]. However neither a coaxial adjustable wideband microwave attenuator nor a combined finely adjustable coaxial attenuation and phase controller have been reported before.

A coaxial linear phase shifter (line stretcher, [13]) is shown in FIG. 3a. It comprises two coaxial line sections (31, 32), of which both the center conductor and the grounding cylinder slide into each-other (33), both said sections being terminated with a coaxial connector each (35, 36). In FIG. 3b it is shown that the center conductor (38) of the enveloping coaxial section (37) must be hollow in order to receive the center conductor (39) of the inserted section (391). In order to avoid significant changes in characteristic impedance (Zo) the walls of (38) and (391) must be very thin, to avoid changing the diameter ratio, which determines Zo. The electrical symbol of such a phase shifter is shown as item (392). By changing the depth one cylinder is inserted into the other we can adjust the electrical length of the unit and thus the phase for each frequency. Depending on the frequency such line stretchers may be very difficult to make, especially establishing continuous and reliable contact between the external and internal coaxial section simultaneously (393, 394) [13].

Variable attenuators are made using π or T configurations of ohmic resistances (395, 396) (T configuration shown in FIG. 3c). In microwave frequencies continuously made resistances cannot be made. Such attenuators are therefore digital, or step-attenuators [8]. The symbol of a step attenuator is shown as (397). The symbol of the combination of a line stretcher and step attenuator is shown in FIG. 3d.

An easier to manufacture phase shifter is based on two sections of slabline with the same characteristic impedance (FIG. 4). Said characteristic impedance depends only on the width (gap) of the slabline (D) and the diameter of the center conductor (d). A rule of thumb is D/d≈1.808; as long as this ratio is kept constant all adjacent sections of the slabline will maintain the same characteristic impedance (Zo). In this case the walls of the receiving center conductor (41) do not need to be very thin, as in (38), as long as the ratio of 1.808 is maintained. This makes manufacturing easier. Also, in order to change the electrical length and transmission phase of the structure of FIG. 4b only the center conductor (42) has to move. However, the moving section of the center conductor (42) must be bent in a "U" form; this allows extending the electrical length of the slabline without moving the ground plates of the slabline itself; another configuration is practically impossible (FIG. 4b).

DESCRIPTION OF THE VARIOUS VIEWS OF THE DRAWINGS

The invention can be better understood in view of the attached drawings:

FIG. 1 depicts prior art; a) single ended RF load pull system; b) single-ended mode; c) differential mode.

FIG. 2 depicts partly prior art: Differential Load Pull System.

FIG. 3 depicts prior art: a) linear coaxial phase shifter; b) variable attenuator; c) amplitude and phase controller; and symbols.

FIG. 4 depicts prior art; linear phase shifter using slabline; a) side view, b) section A-A'

FIG. 5 depicts a) (prior art): Electromagnetic field lines in a slabline; b) (new): variable attenuation using Ferrite sliver in magnetic field.

FIG. 6 depicts variable attenuator in a slabline, version 1.

FIG. 7 depicts variable attenuator in a slabline, version 2.

FIG. 8 depicts concept of variable attenuator-phase shifter (VAPS) in a slabline.

FIG. 9 depicts practical embodiment of VAPS, 1.

FIG. 10 depicts automated VAPS.

FIG. 11 depicts calibration of VAPS using a pre-calibrated VNA.

FIG. 12 depicts transmission factor $S21=|S21|*exp(j\phi 21)$ of VAPS as a function of sliver depth and line stretcher position.

FIG. 13 depicts slabline attenuator using dielectric sliver.

FIG. 14 depicts slabline attenuator using dielectric sliver; cross section.

FIG. 15 depicts VAPS using dielectric sliver.

DETAILED DESCRIPTION OF THE INVENTION

FIG. 5 shows a cross section of a slabline. The electric field lines run from the center conductor to the closest conductive ground surface, which are the metallic slabline walls. The electric field concentration is highest at the area of closest proximity between center conductor and slabline walls (antenna effect). As is well known from electro-magnetic theory, the electric field lines exit the center conductor surface and hit the slabline walls always at a right angle. This is not very well shown in FIG. 5 because of the small size of the graphics, but it is implied; magnetic field lines are closed contours and surround the center conductor, being always perpendicular to the electric field lines. A thin piece (sliver) of ferromagnetic material ([10], 52) is inserted into the slot of said slabline perpendicularly to the center conductor and captures the magnetic field. This induces a deformation of the magnetic field lines and Foucault currents [12] and therefore ohmic loss. The result is a higher attenuation of the transmission line. The closer (51) the ferrite sliver is to the center conductor, where the magnetic field is stronger, the higher and the attenuation. The ferrite sliver (61) can be placed in any section of the transmission line (62). It is obvious that the selection of position will be made for easier manufacturing and handling of the unit (FIGS. 6, 7).

Alternatively to modifying the magnetic field in the slabline, a similar effect can be reached by weakening the electric field. This is shown in FIG. 13. A thin sliver of dielectric material (131), such as Mica [11] is inserted in a narrow slot, parallel to the center conductor of the slabline (FIGS. 13, 14). This deforms the electric field in said slabline and weakens the transmitted signal, which means it increases the attenuation. The slot in said slabline must be very narrow (141) to avoid modification of the characteristic impedance (Zo) of the slabline. Whereas the presence of said slot (141) will bend the electric field lines away, the dielectric septum will bend them back, so the effect is quasi self-compensating. The attenuation increases with diminishing distance between dielectric sliver and center conductor (142).

In both cases, using a magnetic (61) or dielectric (131, 141) sliver (FIGS. 6, 7, 13, 14), the positioning of said sliver must be precisely controlled using appropriate gear. By attaching said gear to electric motors and controllers the units can be manually controlled (FIGS. 9, 15) or automated (FIG. 10). Examples of such manually controlled assemblies are shown in FIGS. 9 and 15; an automated assembly is shown in FIG. 10. In all cases the insertable ferrite or dielectric sliver is attached to a fine screw which can be controlled manually or remotely.

A practical embodiment of the attenuation-phase controller is shown in FIG. 8. The RF signal is entering at the input port coaxial connector (81) and exiting from the output port coaxial connector (82); two sections of tubular center conductor (83, 84) are connected to the center pins of the coaxial connectors (81, 82). A mobile "U" formed section of center conductor (85, 86) is inserted into the tubular sections (83, 84) and can be inserted or withdrawn using a low dielectric constant stud (87) attached to said "U" formed section. This movement adjusts the mechanical and electrical length of the center conductor (83 to 86) and therefore the transmission phase between ports (81) and (82). The characteristic impedance of both sections of the slabline is designed to be equal (Zo). This is done by adjusting the distance between the ground planes of the sections (88) and (89) to match the diameter of the associated center conductors (83, 84) and (85, 86) correspondingly. Finally a ferromagnetic sliver (810) is inserted vertically into the slot of the slabline and approaches the center conductor in order to capture magnetic field energy and attenuate the transmitted signal.

A manually controlled variable attenuation and phase shifter (VAPS) is shown in FIG. 9; compared with the configuration of FIG. 8, this apparatus includes manual precision gear (91, 92) controlling the position of the "U" shaped center conductor (93) and the ferromagnetic sliver (94). A section of the manually controlled VAPS using a dielectric sliver instead of a ferromagnetic one is shown in FIG. 15; hereby the total length of the center conductor (153) which makes the phase shifter is controlled by the gear (151) and the depth of the dielectric sliver (154) by the precision gear (152).

A remotely controlled (automated) variable attenuation and phase shifter is shown in FIG. 10; the manual precision gear is replaced by remotely controlled electrical stepper motors and associated movement translation gear (101, 102). Motor positions and any required electrical switches in order to define reference positions of either the line stretcher (104) or the ferromagnetic (or dielectric) slivers (105), are controlled by a control computer (103), equipped with the necessary motor control electronics, which can be part of the motor assembly or part of the computer.

A remotely controlled variable attenuator and phase shifter (VAPS) can be calibrated in a setup as shown in FIG. 11, and used in a "targeted" manner, meaning being able to generate user-defined attenuation and phase values of its transmission factor (S21) at any given frequency within the band of operation by remote control. For this the electrical parameters (in this case the RF parameters at a selected frequency, or scattering parameters —s-parameters) can be measured using a pre-calibrated vector network analyzer (VNA, FIG. 11), which is communicating and controlled by the Control PC using appropriate communication means and protocols, such as LAN, GPIB or USB. The Control PC uses well known in the art motor control electronic interfaces and runs appropriate software to set the motor positions; through the gear then the dielectric or ferrite sliver are set to a number of pre-defined positions (distances from the center conductor); the VNA measures the 4 s-parameter calibration data between the input port (112) and the output port (111) of the VAPS unit and the data are collected by the Control PC. The calibration data are saved on a computer file for later use. For all positions of the sliver and the line stretcher said VAPS unit will have typically low reflection factor (S11) and adjustable transmission factor (S21). S11 will remain low as long as the magnetic or dielectric sliver do not affect strongly the electric or magnetic field correspondingly. However the amplitude of the transmission factor S21 is controlled by the first motor (113), which controls the depth of said sliver into the slabline; said amplitude |S21| will be reduced with increasing proximity of said sliver to the center conductor of said slabline. The phase $\phi 21$ of the transmission factor S21 is controlled by the second motor (114), which adjusts the electrical length of the center conductor of said slabline by sliding in or out the core conductor (115) from the tube (116).

An example of such calibration data is shown in FIG. 12. The polar diagram shows the transmission factor of the VAPS unit as a function of sliver depth and line stretcher electrical length. The closer the sliver gets to the center conductor, the smaller the amplitude |S21| or the equivalent—the higher the attenuation (Attenuation=1/|S21|). The more the "U" formed conductor section (115) is extracted from the larger tubular one (116) the longer the electrical length and the more negative the angle $\phi 21$.

The complex number $S21=|S21|*\exp(j\phi 21)$ is saved in a calibration file as a function of the two stimuli (positions): X, Y; hereby X is the electrical length of the center conductor of said slabline (adjusted by inserting the "U" section (42, 115) inside the tubes, ((41) in FIG. 4 and (116) in FIG. 11); and Y is the distance (51), in FIG. 5, of the magnetic sliver from said center conductor (FIG. 5), or the distance (142) of the dielectric sliver (141) from said center conductor in FIG. 14.

The calibration data can be retrieved by appropriate software from the computer memory and a simple search algorithm allows generating any user-defined S21 of the VAPS. Well known interpolation techniques allow also reaching user-defined attenuation and phase conditions between calibration data points.

This application discloses the concept of an integrated wideband variable attenuator and linear phase shifter for microwave frequencies, either in manual or automated form. Obvious alternatives shall not impede on the originality of the concept.

What I claim is:

1. A continuously variable microwave attenuator and phase shifter comprising a cascade of an adjustable attenuator and a linear phase shifter;

whereby
said attenuator comprises a parallel plate airline (slabline) having an input and an output port and a center conductor between said ports; and a ferromagnetic sliver being insertable perpendicularly to the axis of said center conductor of said slabline, wherein said sliver captures the magnetic field inside said slabline;

and whereby
said phase shifter comprises the input port and the output port and the slabline between said ports; and a "U" shaped center conductor between said ports; said slabline comprising two adjacent sections, the first section being connected to said ports and the second section being attached to the first section;

said "U" shaped center conductor comprising two sections:
a first, fixed section comprising two parallel straight pieces of tubular center conductor with one piece being the center conductor of the attenuator, associated with the first section of said slabline, said pieces being connected to a phase shifter port each;
and a second, mobile "U" shaped section of solid center conductor, associated with the second section of slabline and of which each leg is insertable into the corresponding tubular pieces of center conductor associated with the first slabline section.

2. A calibration method for a variable attenuator and phase shifter (VAPS) as in claim 1, wherein said VAPS is connected to a pre-calibrated vector network analyzer (VNA) using RF cables; and scattering (s-) parameters are measured by the VNA between the input port and the output port of said VAPS for various settings of the attenuator section and the phase shifter section said settings being set by a control computer, which is in operative communication with said VNA; said s-parameters being retrieved by the control computer and saved in calibration files for later use.

3. A differential load pull system comprising a signal source, connected to the single ended port of an input balun; and an input VAPS, as in claim 1, connected to one differential port of said input balun; and a fixed input attenuator connected to the other differential port of said input balun; the output port of said fixed input attenuator and the output port of said input VAPS being connected to the input ports of an input differential impedance tuner; the output ports of said input differential tuner being connected to the input ports of a differential test fixture, in which a differential device under test (DUT) is mounted; and an output differential tuner of which input ports are connected to the output ports of said differential test fixture; one of the output ports of said output differential tuner being connected to the input port of an output VAPS and the other to a fixed output attenuator; the output ports of said output VAPS and said fixed output attenuator being connected to the differential ports of an output balun; the single ended output port of said output balun being connected to a power detector.

4. An attenuator as in claim 1, wherein the position of said ferromagnetic sliver relative to said center conductor is manually adjustable.

5. An attenuator as in claim 1, wherein the position of said ferromagnetic sliver relative to said center conductor is remotely adjustable by electrical motors and associated gear.

6. An attenuator and phase shifter as in claim 1, wherein the penetration of the mobile section of the "U" shaped center conductor into the fixed tubular sections of the center conductor is manually controlled.

7. An attenuator and phase shifter as in claim 1, wherein the penetration of the mobile section of the "U" shaped center conductor into the fixed tubular sections of the center conductor is remotely adjustable using electrical motors and associated gear.

8. An attenuator and phase shifter as in claim 1, wherein the insertion depth of the ferromagnetic sliver inside the slabline slot and the penetration of the mobile section of the "U" shaped center conductor into the fixed tubular sections of the center conductor are manually controlled.

9. An attenuator and phase shifter as in claim 1, wherein the insertion depth of the ferromagnetic sliver inside the slabline slot and the penetration of the mobile section of the "U" shaped center conductor into the fixed tubular sections of the center conductor are remotely controlled using electrical motors and associated gear.

10. An attenuator and phase shifter as in claim 1, wherein each combination of slabline and center conductor sections have the same characteristic impedance (Zo).

11. An attenuator and phase shifter as in claim 10, wherein Zo is typically 50 ohms.

* * * * *